(12) United States Patent
Sakamoto et al.

(10) Patent No.: US 6,402,399 B2
(45) Date of Patent: Jun. 11, 2002

(54) DEVELOPING METHOD AND DEVELOPING APPARATUS

(75) Inventors: Kazuo Sakamoto; Shuuichi Nishikido, both of Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/837,942

(22) Filed: Apr. 18, 2001

Related U.S. Application Data

(62) Division of application No. 09/312,541, filed on May 14, 1999, now Pat. No. 6,241,403.

(30) Foreign Application Priority Data

May 26, 1998 (JP) .............................................. 10-144083

(51) Int. Cl.$^7$ ................................................. G03D 5/00
(52) U.S. Cl. ...................... 396/604; 396/611; 396/627; 118/52; 427/240
(58) Field of Search .................................. 396/604, 611, 396/627; 118/52, 56, 319–321, 500, 666–670, 694, 696, 716; 427/240; 134/902, 153, 157

(56) References Cited

U.S. PATENT DOCUMENTS

| | | | | |
|---|---|---|---|---|
| 4,922,277 A | * | 5/1990 | Carlson et al. | 396/611 |
| 5,489,337 A | * | 2/1996 | Nomura et al. | 118/677 |
| 5,821,035 A | * | 10/1998 | Hirano et al. | 430/311 |
| 5,942,035 A | * | 8/1999 | Hasebe et al. | 118/52 |
| 5,962,070 A | * | 10/1999 | Mitsuhashi et al. | 427/240 |
| 6,190,063 B1 | * | 2/2001 | Akimoto | 396/611 |

FOREIGN PATENT DOCUMENTS

JP    04-097514 A    *    3/1992

* cited by examiner

*Primary Examiner*—D Rutledge
(74) *Attorney, Agent, or Firm*—Fulbright & Jaworski L.L.P.

(57) ABSTRACT

A developing method comprising, a step of holding a substrate in substantially a horizontal position, the substrate coated with a photoresist film which has a pattern-exposed region where a predetermined circuit pattern is formed by light exposure, and a step of developing the photoresist film by starting to apply, at a time, a developing solution to the entire pattern-exposed region of the photoresist film.

7 Claims, 4 Drawing Sheets

DEVELOPING METHOD AND DEVELOPING APPARATUS

This application is a divisional of U.S. Ser. No. 09/312,541, filed May 14, 1999, now U.S. Pat. No. 6,241,403.

BACKGROUND OF THE INVENTION

The present invention relates to a developing method and a developing apparatus, and more particularly, to a method and developing apparatus for performing a developing process by applying developing solution to a surface of a substrate such as a semiconductor wafer.

To manufacture a semiconductor device, photolithography technique is used. In the photolithography technique, photoresist is coated on a semiconductor wafer, thereby forming a photoresist film on one surface of the wafer. The photoresist film is exposed to a predetermined circuit pattern and then developed. Thus, a predetermined pattern photoresist film is formed on the wafer.

In general, the wafer is developed in the following manner. First, the developing solution is continuously applied from a nozzle to the photoresist film to which the circuit pattern has been exposed. The applied developing solution forms a layer, which contacts that surface of the photoresist film. The layer of developing solution is maintained on the resist film for a prescribed time, by continuously applying the developing solution.

Recently, a linear nozzle 100 of the type shown in FIG. 7 is used to apply developing solution in order to save the developing solution and to apply a developing solution uniformaly over an entire surface of the wafer. The linear nozzle 100 has a number of discharge holes 101 arranged in a straight line. To develop the resist film formed on a wafer 102, the nozzle 100 is moved to face the wafer 102. The nozzle 100 applies the developing solution through the holes 101 onto the wafer 102, in the form of parallel streams. When the streams of developing solution merge on the surface of the resist film to form a film-like stream, then, the wafer 102 is slowly rotated by 180°. After the developing solution layer covers the entire surface of the resist film, the rotation speed of the wafer 102 is increased.

The conventional method of developing the resist film by the use of the linear nozzle 100 is, however, disadvantageous in the following respects:

(1) It takes some time until the developing solution 103 spreads all over the pattern-forming surface of the wafer 102. This is because the wafer 102 is rotated only after the developing solution 103 is applied onto the resist film. Consequently, that part of the resist film, which first contacts the developing solution 103 may differ from any other part of the resist film in terms of resolution.

To be more specific, the parallel streams of developing solution 103 applied through the holes 101 merge together on the resist film, forming a film-like stream. The wafer 100 must be rotated only after the developing solution forms a film-like stream. It is therefore impossible to rotate the wafer 102 before or at the same time the developing solution 103 first contacts the photoresist film. As a consequence, that part of the resist film, which first contacts the solution 103, may be developed to excess, unlike any other part of the resist film.

(2) Second, much attention must be now pad to the influence of the first impact given by the developing solution 103 that first contacts the resist film.

That is, when the valve connected to the linear nozzle 100 is opened to supply the developing solution 103 to the nozzle 100, the pressure on the solution 103 increases momentarily. Thus, the streams of developing solution applied from the nozzle 100 give the first impact to the wafer 102. Consequently, that part of the resist film, which first contacts the solution 103, is developed to excess, unlike any other part of the resist film.

The circuit patterns recently designed and formed on the wafer consist of very fine elements arranged in high density, and the resist film must be processed with high resolution. This is why the influence of the first impact, which has hitherto been neglected, now needs to be considered.

As described above, the conventional developing method is disadvantageous in view of the non-uniform development of the resist film, which results not only from the different timings of applying the developing solution to the resist film, but also from the influence of the first impact of developing solution.

BRIEF SUMMARY OF THE INVENTION

The present invention has been made in view of the foregoing. Its object is to provide a developing method and a developing apparatus, which solves various problems arising in applying a developing solution on a wafer, thereby to properly develop the photoresist film formed on the wafer.

More particularly, the object of the invention is to provide a developing method and a developing apparatus, in which no time lag in the application of developing solution for the parts of the resist film takes place, making it possible to develop the photoresist film uniformly.

Another object of the invention is to provide a developing method and a developing apparatus, which prevent the first impact of the developing solution on the photoresist film from impairing the developing of the photoresist film.

To attain the objects of the invention, a developing method according to the first aspect of the invention comprises the steps of: holding a substrate in a substantially horizontal position, the substrate coated with a photoresist film which has a pattern-exposed region where a circuit pattern is formed by light exposure; and developing the photoresist film by applying, at a time, a developing solution to the entire pattern-exposed region of the photoresist film.

In the cross-sectional area of the photoresist film, which can be applied with the developing solution at a time, is larger than in the conventional method in which the solution is applied by the linear nozzle. The developing solution can be therefore applied at a lower speed to the pattern-forming region of the resist film. Hence, it is possible to reduce the influence that the first impact of solution imposes on the resist film.

The developing solution may be is applied to the resist film, in the form of parallel streams. However, the streams of solution merge on the resist film, forming a layer of solution thereon more quickly than in the conventional method. Therefore, the substrate can be rotated before the start of applying the developing solution to the photoresist film, and at a higher speed than in the conventional developing method. Moreover, this effectively reduces the influence of the first impact of developing solution.

With the developing method of the invention it is possible to apply the developing solution, almost at a time, to the entire pattern-exposed region of the resist film. Thus, no time lag in the application of solution for the parts of the resist film takes place. This makes it possible to develop the resist film uniformly. As a result, the resist film can have uniform resolution over its entire pattern-exposed region.

In the developing method of the invention, if the developing solution is applied at a higher rate, the developing solution can be uniformaly applied over the entire photoresist film without rotating the substrate.

According to the second aspect of the present invention, there is provided a developing apparatus which comprises: a substrate holding mechanism for holding a substrate in a substantially horizontal position, the substrate coated by a photoresist film which has a pattern-exposed region where a circuit pattern is formed by light exposure; a solution discharging unit having a number of discharge tubes, each having a distal end opposing the pattern-exposed region of the photoresist film; a solution applying mechanism for applying the developing solution to the pattern-exposed region of the photoresist film through the discharge tubes; and a control section for controlling the solution applying mechanism, thereby to apply the developing solution to the entire pattern-exposed region substantially at a same time.

Comprising these components, the developing apparatus can perform the developing method according to the first aspect of the invention. The apparatus may be designed such that the developing solution is applied through some of the discharge tubes to develop the resist film formed on a small wafer, and through all discharge tubes to develop the resist film formed on a large wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 1:
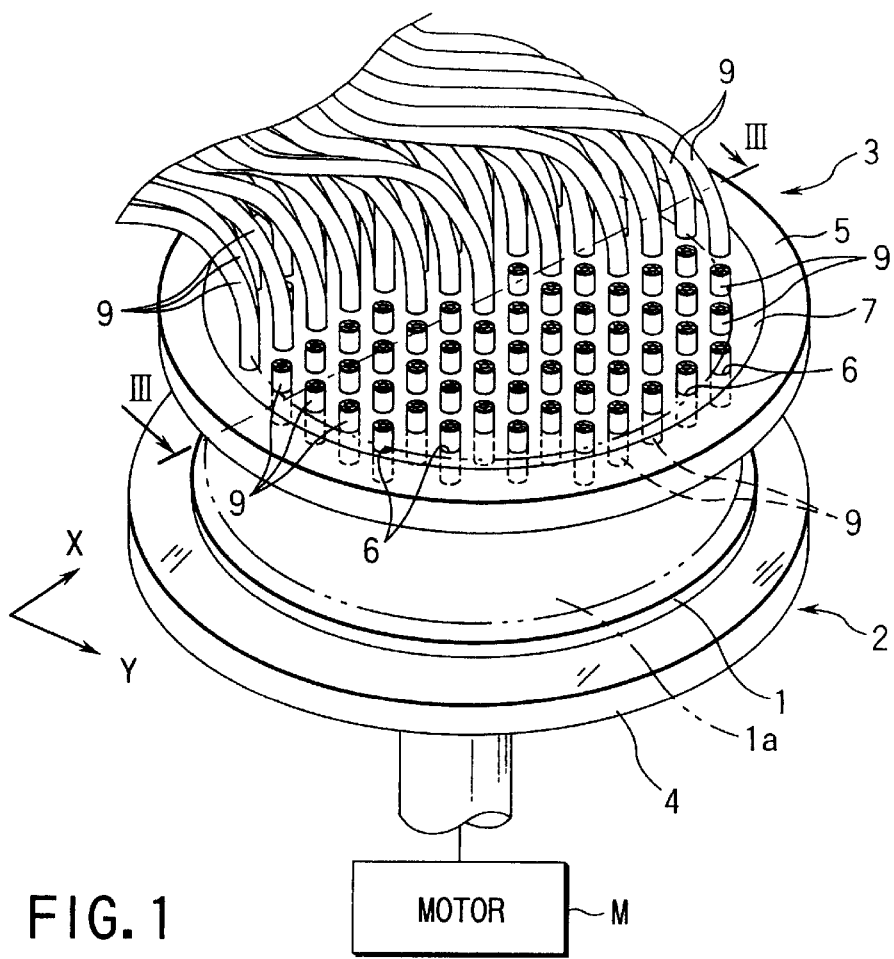
FIG. 1 is a perspective view of the principal section of an embodiment of the present invention.

FIG. 1 is a partly sectional, perspective view of a developing apparatus that performs the developing method according to an embodiment of the invention.

The developing apparatus comprises a wafer-holding unit 2 for holding a wafer 1 and a developing solution-applying unit 3 for applying developing solution onto the wafer 1.

The wafer holding unit 2 comprises a spin chuck 4 which hold the wafer 1 by means of vacuum suction and a motor M for rotating the spin chuck 4.

The solution-applying unit 3 has a bracket 5, a thin support plate 7, and a number of discharge tubes 9. The bracket 5 is, for example, a ring-shaped member and can be located above the spin chuck 4 of the wafer holding unit 2. The support plate 7 is held in the bracket 5 and has a number of small holes 6. The discharge tubes 9 have each a downstream end inserted in one small hole 6 of the support plate 7. Each discharge tube 9 is, for example, a fluororesin tube having an inner diameter of, for example, 0.5 mm. The downstream ends of the tubes 9 are arranged in the support plate 7, at a pitch of, for example, 5 mm in both X-axis direction and Y-axis direction. The tubes 9 are provided in such numbers that they cover almost an entire pattern-forming region 1a (which is also referred to as "pattern-exposed region" of a resist film) of the wafer 1.

Figure 2:
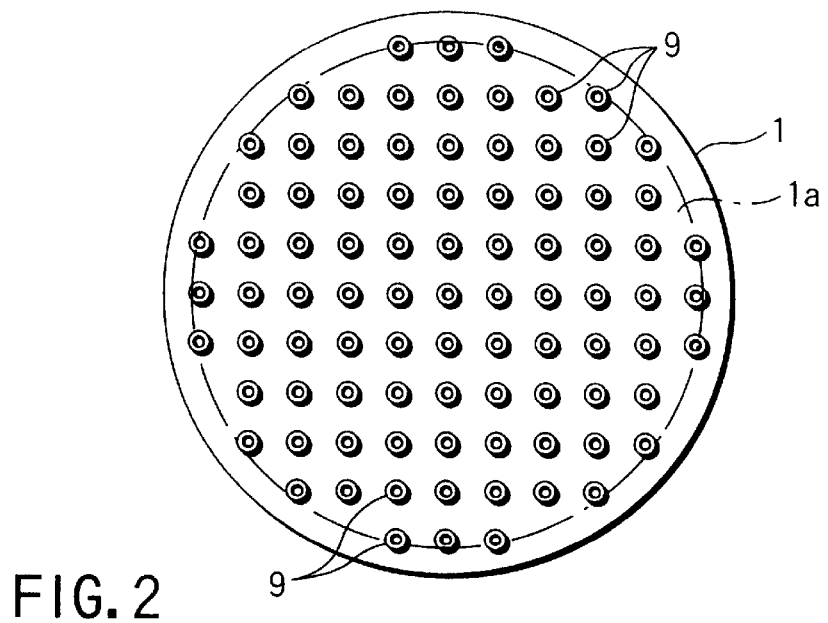
FIG. 2 is a plan view, illustrating the positional relation between the pattern-forming region of a wafer and the discharge tubes of the embodiment.

FIG. 2 is a plan view, illustrating the positional relation between the pattern-forming region 1a of the wafer 1 and the discharge tubes 9. As shown in FIG. 2, none of the discharge tubes 9 are located outside the pattern-forming region 1a. This helps to minimize the consumption of developing solution.

Figure 3:
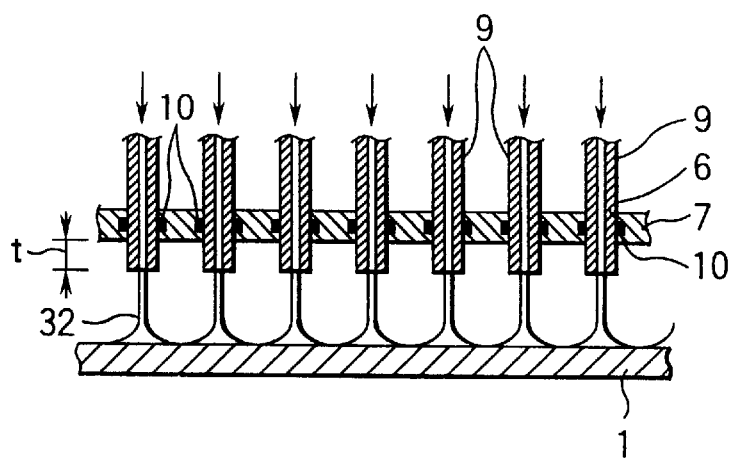
FIG. 3 is a partially sectional view of the first embodiment, taken along line I—I in FIG. 1.

FIG. 3 is an enlarged, partially sectional view of the central part of the solution-applying unit 3, taken along line I—I in FIG. 1. As shown in FIG. 3, the support plate 7 is a thin plate made of fluororesin and having a thickness of, for example, 2 mm. O-rings 10 are fitted in the small holes 6, respectively. More precisely, each O-ring 10 is embedded in the inner surface of one small hole 6, and resiliently clamps the downstream end of the discharge tube 9, thereby holding each discharge tube 9 not to move up or down. The discharge tubes 9 protrude downwards from the lower surface of the support plate 7, preferably for a distance t of about 3 mm. This prevents the developing solution from dribbling from the distal end of each discharge tube 9, for the reason that will be described later.

Figure 4:
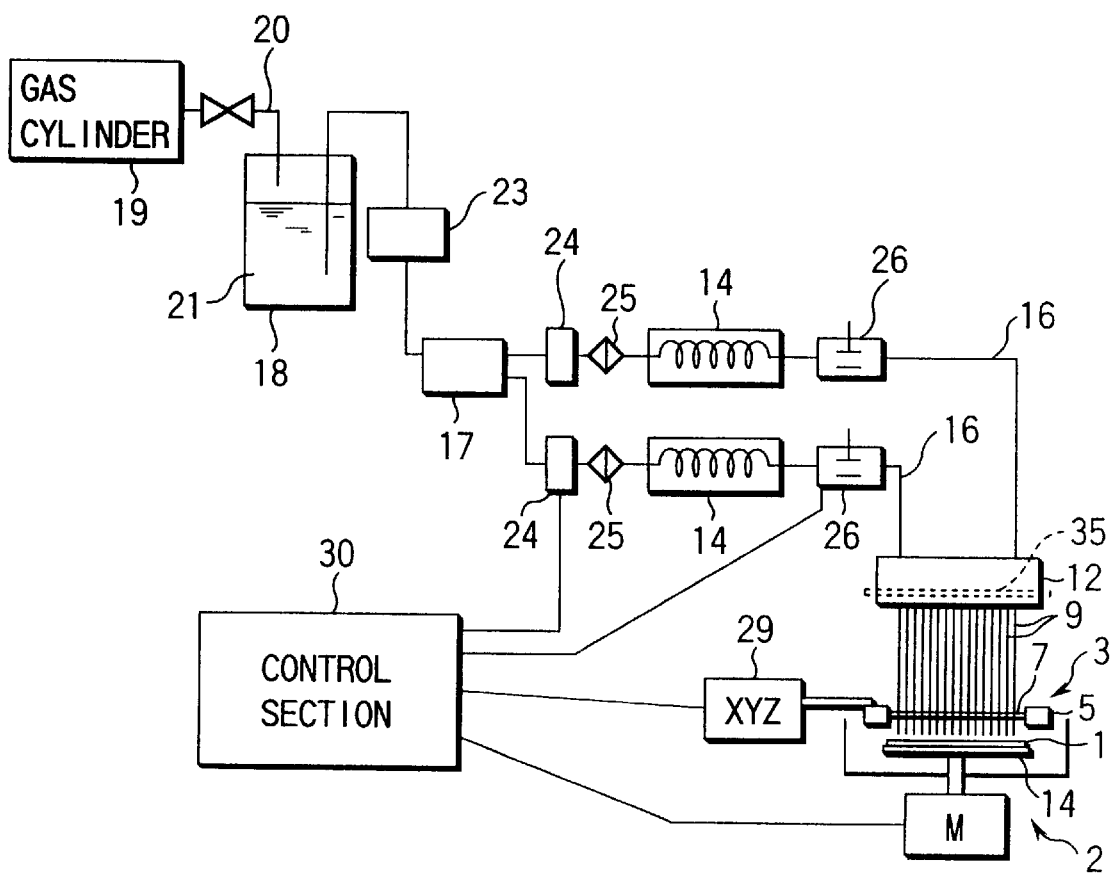
FIG. 4 is a circuit diagram showing the embodiment including a solution applying system.

FIG. 4 is a diagram showing the entire developing apparatus including the solution-supplying system that is connected to the upstream end of every discharge tube 9. The solution-supplying system will be described below.

The discharge tubes 6 extending upwards from the support plate 7 are bundled together and connected to the solution-distributing manifold 12. The solution-distributing manifold 12 has a solution reservoir (not shown), with which the discharge tubes 9 communicate.

A pair of pipes 16 extend from the ends of the manifold 12. The pipes 16 are connected at one end to the solution reservoir and at the other end to an intermediate tank 17. The intermediate tank 17 is connected to the developing solution tank 18 by a pipe 22.

The developing solution tank 18 is connected to a gas cylinder 19 by a gas pipe 20. The cylinder 19 stores gas such as nitrogen gas. The gas is supplied from the cylinder 19 via the gas pipe 20 into the tank 18, forcing the developing solution from the tank 18 to the manifold 12 through the pipes 16.

A deaeration mechanism 23 is provided on the pipe 22 connecting the tank 18 to the intermediate tank 17. The deaeration mechanism 23 is designed to remove gas, in the form of bubbles, from the developing solution.

A flow control valve 24, a filter 25, a water jacket 14, and a control valve 26 are provided on each of the pipes 16 that connect the intermediate tank 17 to the manifold 12. The flow control valve 24 controls the rate at which the developing solution flows through the pipe 16. The filter 25 removes impurities from the developing solution. In the water jacket 14, water adjusted to a desired temperature (temperature-adjusted water) is flowing. The control valve 26 can open and close the pipe 16. The developing solution supplied from the tank 18, passing through the components 23 to 26 in two streams, is merged in the above-mentioned solution reservoir of the manifold 12, and is redistributed into the discharge tubes 9.

Then, the developing solution is applied form the distal ends of the discharge tubes 9 in the form of thin streams. These streams simultaneously reach the entire pattern-forming region la of the wafer 1 held on the spin chuck 14.

Note that, in FIG. 4, reference numeral 29 shows a XYZ drive mechanism provided to move the ring-shaped bracket 5.

Figure 5:
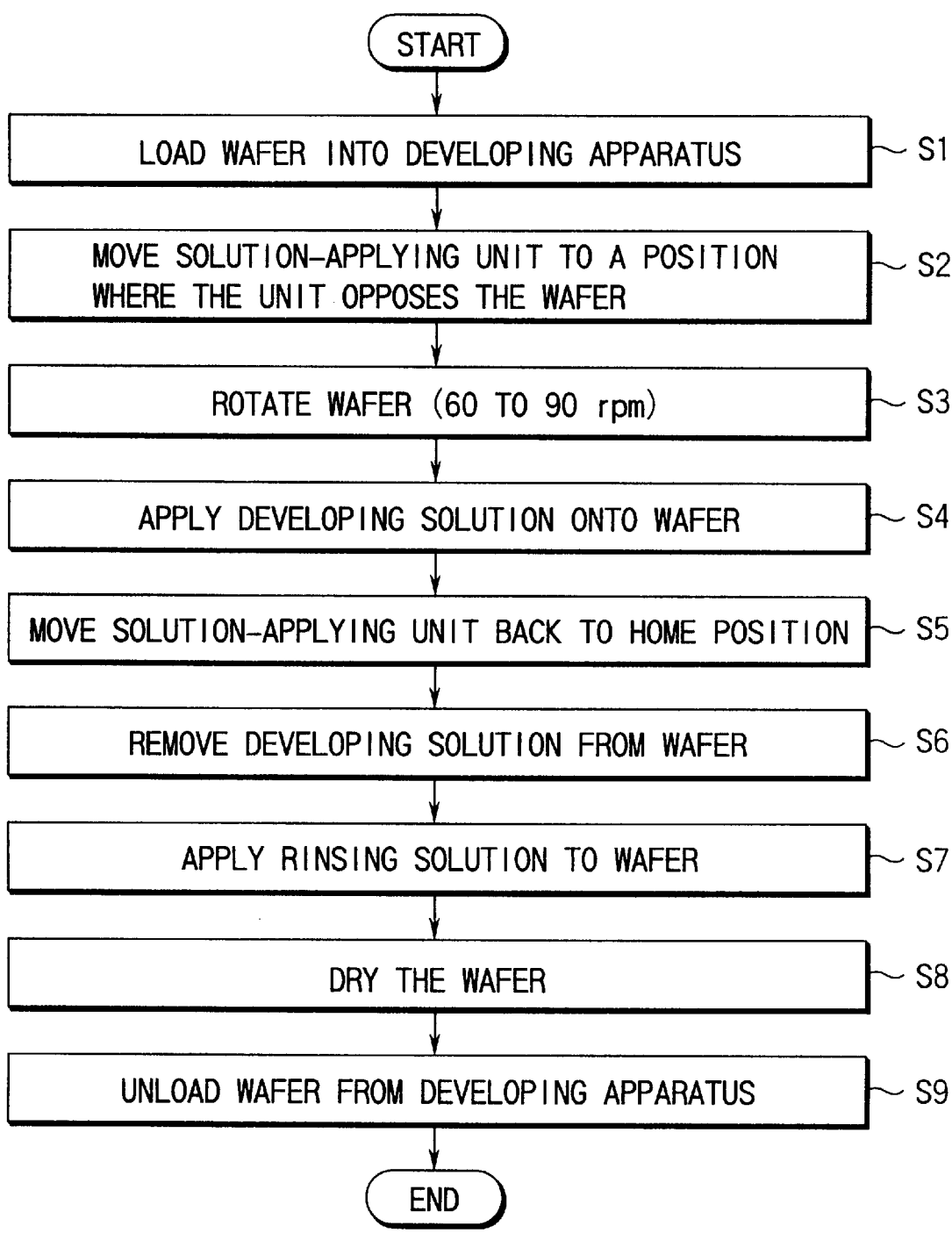
FIG. 5 is a flow chart explaining the developing process the embodiment performs.

The flow control valves 24, control valves 26, motor M and XYZ derive mechanism 29 are connected to a control section 30, as is illustrated in FIG. 4. The control section 30 controls the valves 24 and 26, motor M and mechanism 29 to perform developing process, as will be explained below with reference to the flow chart of FIG. 5.

(1) First, the wafer 1 having a resist film coated on the major surface, on which a circuit pattern has been formed by means of light exposure is loaded into the developing apparatus (Step S1). More precisely, the wafer 1 is supported by a main arm (not shown) and transferred to the spin chuck 14, and the spin chuck 14 is driven, holding the wafer 1 by means of vacuum suction. At this time, the solution-applying unit 3 remains at the home position (not shown).

(2) Then, the solution-applying unit 3 is moved from the home position to a position, where it opposes the pattern-forming region la of the wafer 1 held on the spin chuck 14 (Step S2). To state more specifically, the unit 3 is positioned so that the distal end of each discharge tube 9 is faces and is aligned with the wafer 1 at a distance of, for example, 10 mm, as is illustrated in FIG. 3. This distance may be changed, preferably within the range of 7 mm to 10 mm.

(3) Next, the motor M is turned on, thereby rotating the wafer 1 at low speed of 60 to 90 rpm (Step S3).

(4) At the same time or immediately after the start of low-speed rotation of the wafer 1, the flow control valves 24 and control valves 26 are operated, thereby applying the developing solution through the discharge tubes 9 to the resist film formed on the wafer 1 (Step S4).

Figure 7:
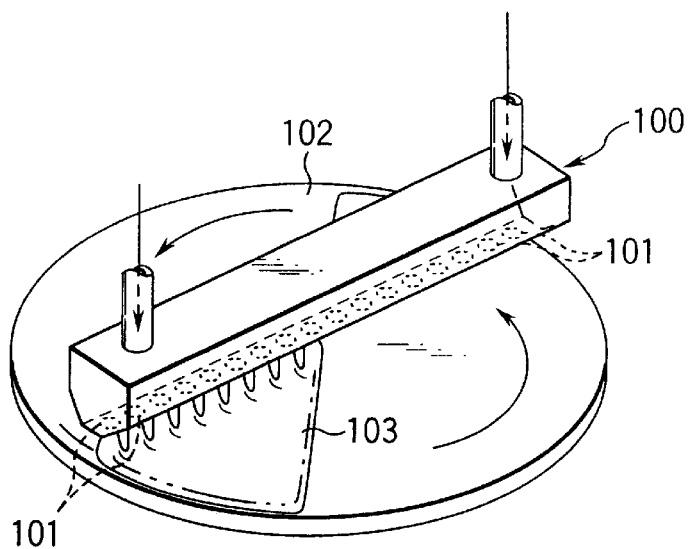
FIG. 7 is a perspective view explaining the conventional developing method.

The rate at which the solution is applied to the wafer 1 is determined by the size of the wafer 1. If the wafer 1 is an 8-inch wafer, this rate is almost the same as in the conventional method (FIG. 7) or is lower than in the conventional method, for example, 2 to 3 liters per minute. Since the total sectional area of discharge ports (i.e., the sum of the inner sectional areas of the discharge tubes 9) is larger than that of the discharge holes 102 of the conventional nozzle 100, the flow rate of the developing solution applied through the discharge tubes 9 is controlled to one third of the flow rate in the conventional method.

Therefore, the developing solution 3 slowly flows of oozes from all discharge tubes 9 to the surface of the wafer 1 as shown in FIG. 3. The low-speed rotation of the wafer 1 at 60 to 90 rpm is continued until the wafer 1 turns through at least 180°. In other words, the rotation proceeds until the developing solution applied to the resist film formed on wafer 1 forms a layer that covers the entire surface of the resist film.

The streams of developing solution 32 are applied to almost an entire surface of the wafer 1 at a time and immediately merge together, forming a layer covering the entire surface of the resist film. This makes it possible to apply the solution almost at the same time as the rotation of the wafer 1 is started or immediately after the rotation of the wafer 1 is started. Namely, the wafer 1 need not be stopped until the streams of developing solution merge to form a film, unlike in the conventional method. In the conventional method, the rotation of the wafer 102 is started upon laps of 0.3 seconds after the streams of developing solution first reach the surface of the wafer 102, or when these streams merge together to form a film-like stream on the resist film.

Further, in the developing apparatus shown in FIG. 4, the discontinuation of some of the streams of developing solution from the discharge tubes does not influence to make the solution 9 cover the entire surface of the wafer 1. The wafer 1 can therefore be rotated faster than in the conventional method. More specifically, the wafer 1 is rotated at 60 to 90 rpm, which is about twice higher than the speed (30 rpm) at which the wafer 102 is rotated in the conventional method.

The developing solution is thereby continuously applied to the pattern-forming region 1a of the wafer. Thus applied, the developing solution can thoroughly and uniformly develop the resist film formed on the wafer 1.

(5) Upon lapse of a predetermined time, the application of developing solution is stopped and the solution-applying unit 3 is moved back to the home position (Step S5). Meanwhile, the spin chuck 14 rotates the wafer 1 at high speed, whereby the developing solution swiftly moves away from the wafer 1 (Step S6).

At this time, since the discharge tubes 9 protrude downwards from the lower surface of the support plate 7 by a predetermined distance, the developing solution is therefore prevented from dripping from the distal ends of the tube 9. More precisely, in this case the discharge tubes 9 are spaced apart from one another, and the developing solution remains at the distal end of each discharge tube 9 in a smaller amount than otherwise.

By contrast, if holes to charge the solution were made in the support plate 7 and the developing solution were applied through these holes as in the case of using the linear nozzle 100 (FIG. 7), the solution might remain on the lower surface of the support plate 7. If this happened, the developing solution would drip therefrom onto the resist film. (6) Next, a rinse nozzle (not shown) is moved to a position right above the wafer 1 and applies a rinse solution to the wafer 1, thus rinsing the wafer 1 (Step S7). To be more specific, the rinse solution is dripped from the rinse nozzle onto the resist film formed on the wafer 1, thereby rinsing the surface of the wafer 1.

The application of rinse solution is stopped while the wafer 1 keeps on rotating, and the wafer 1 is left to stand to be dried (Step S8).

(7) Upon completion of the developing process, the main arm (not shown) holds the wafer 1, moves the wafer 1 from the spin chuck 14 and transports the wafer 1 from the developing apparatus (Step S9).

The resist-developing method described above is advantageous in the following aspects.

First, the entire resist film formed on the pattern-forming region 1a of the wafer 1 can be developed in uniform resolution, because the developing solution applied at the same time to any parts of the wafer 1.

By contrast, a resist film developed by the conventional method may not have uniform resolution. This is because the wafer is rotated while the developing solution is being applied to the film through discharge holes 101 of the nozzle 100 which are arranged in a straight line and. It takes several seconds until all resist film first applied with the developing solution. Consequently, the part of the resist film, which is first applied with the developing solution, may considerably differs in resolution from the part of the film, which is spaced apart by 180° and is therefore last applied with the developing solution.

In the developing method of the present invention, no time lag in the application of developing solution for the parts of the resist film takes place, and every part of the resist film is developed in the same resolution.

Furthermore, unnecessary use of developing solution can be prevented to save the solution in the developing method of the present invention. This is because the distal ends of the discharge tubes 9 oppose only the pattern-forming region 1a of the wafer.

Second, non-uniform development of the resist film, which results from the influence of the first impact of developing solution can be effectively prevented. This is because the total sectional area of discharge tubes 9 is larger than that of the discharge holes 102 of the conventional nozzle 100 and the flow rate of the developing solution applied through the discharge tubes 9 is therefore lower than in the conventional developing method. As a result, the influence of the first impact of developing solution can be reduced.

Moreover, with the developing method of the present invention it is possible, as mentioned above, to apply the developing solution almost at the same time as the rotation of the wafer 1 is started or immediately after the rotation of the wafer 1 is started. The developing solution cannot be applied in this manner if the conventional nozzle 100 (FIG. 7) is used. This is why the local influence of the first impact of developing solution can be minimized in the present invention.

Since the developing solution is applied at a time to the entire surface of the wafer 1, the influence of the first impact of developing solution can be made substantially uniform over the surface of the wafer 1. This helps to develop the resist film formed on the wafer 1 in uniform resolution and. That is, this prevents any part of the resist film from being developed excessively.

Now, the conventional developing method (FIG. 7) and the developing method of the invention were performed to obtain 0.4 L/S patterns and to compare the developing uniformity(or resolution) between the two methods. The circuit pattern obtained by the method of the invention had line-width developing uniformity of 20 nm, whereas the circuit pattern obtained by the conventional method had line-width uniformity of 40 nm. This result demonstrates the advantage of the present invention.

The present invention is not limited to the embodiment described above. For instance, the developing solution applying system may control the discharge speed or ON/OFF timing for each of the discharge tubes 9 independently or for a selected group of the discharge tubes 9. In this case, the developing solution can be applied through a group of tubes 9 which are arranged in the center part of the support plate 7 only, to develop the resist film formed on an 8-inch wafer. The solution can be applied through all of the tubes 9 to develop the resist film formed on a 12-inch wafer. The developing solution can be applied in such different modes as described in the preceding paragraph, merely by interchangeably providing various partitions 35 in the solution-distributing manifold 12 as is illustrated in FIG. 4.

In the embodiment, the developing solution is applied to the wafer 1 through the discharge tubes 9 while the wafer 1 is being rotated. Nonetheless, the wafer 1 need not be rotated at all during the application of the developing solution, if the solution is applied at a higher rate of, for example, 4 to 5 litters per minute.

Figure 6A:
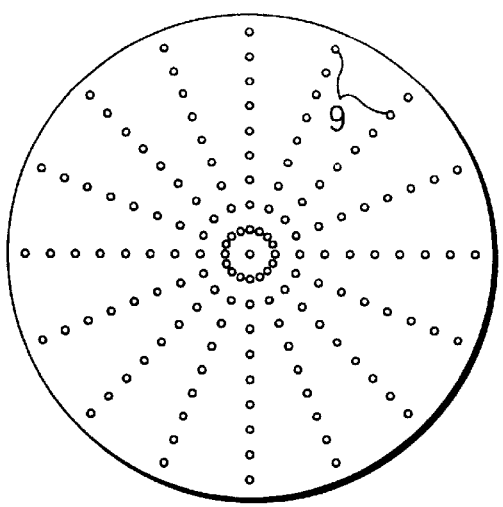
FIGS. 6A to 6C shows three alternative arrangements of the discharge tubes, respectively.
Figure 6B:
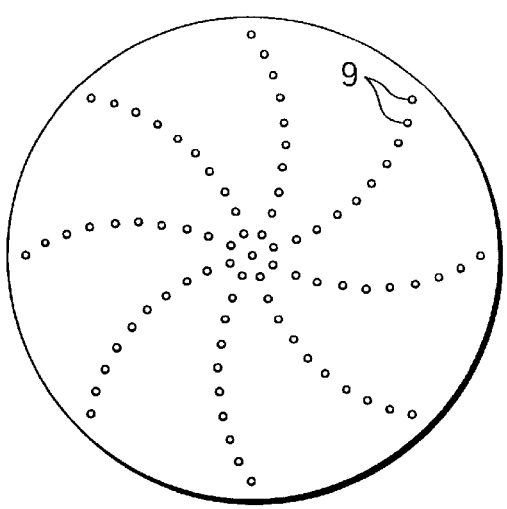
Figure 6C:
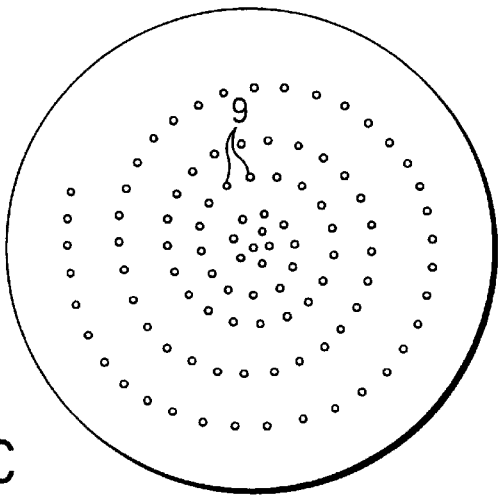

In the embodiment, the discharge tubes 9 have their distal ends arranged in rows and columns in the support plate 7 as is illustrated in FIG. 2. The arrangement of the tubes 9 is not limited to this. Rather, it can be modified in accordance with various conditions such as the rotation speed of the wafer 1. In accordance with the rotation speed of the wafer 1, the tubes 9 may have their distal ends arranged in radial lines as shown in FIG. 6A, in arcs extending from the center of the plate 7 as depicted in FIG. 6B, or in a spiral as illustrated in FIG. 6C.

Further, various changes and modifications can be made, without departing from the scope and spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A development method comprising:
   a step of holding a substrate in substantially a horizontal position, said substrate coated with a photoresist film which has a pattern-exposed region where a predetermined circuit pattern is formed by light exposure;
   a step of developing the photoresist film by starting to apply, at a time, a developing solution to the entire pattern-exposed region of the photoresist film, wherein the step of developing the photoresist film has a step of rotating the substrate at a predetermined speed.

2. A method according to claim 1, wherein, in the step of developing the photoresist film, the application of the developing solution is started at the same time the rotation of the wafer is started or immediately after the rotation of the wafer is started.

3. A developing method comprising:
   a step of holding a substrate in substantially a horizontal position, said substrate coated with a photoresist film which has a pattern-exposed region where a predetermined circuit pattern is formed by light exposure: and
   a step of developing the photoresist film by starting to apply, at a time, a developing solution to the entire pattern-exposed region of the photoresist film, wherein, in the step of developing the photoresist film, the application of the developing solution is started, at a time, for the entire pattern-exposed region of the photoresist film, by applying the developing solution through a number of discharge tubes that oppose the entire pattern-exposed region.

4. A method according to claim 3, wherein, in the step of developing the photoresist film, the developing solution is applied while a distal end of each discharge tube remains spaced from the substrate by a distance of 4 mm to 10 mm.

5. A method according to claim 3, wherein the discharge tubes have distal ends spaced apart from one another by a predetermined distance.

6. A method according to claim 5, wherein the distal ends of the discharge tubes are arranged in rows and columns.

7. A method according to claim 5, wherein the distal ends of the discharge tubes are arranged in radial lines.

* * * * *